(12) United States Patent
Shaikh et al.

(10) Patent No.: US 10,642,689 B2
(45) Date of Patent: May 5, 2020

(54) SYSTEM AND METHOD FOR INLINE ERASURE CODING FOR A DISTRIBUTED LOG STRUCTURED STORAGE SYSTEM

(71) Applicant: Cisco Technology, Inc., San Jose, CA (US)

(72) Inventors: Faraz Ahmed Shaikh, Sunnyvale, CA (US); Swapnil Pimpale, Sunnyvale, CA (US); Jyothir Ramanan, Sunnyvale, CA (US); Ashwin Pednekar, San Jose, CA (US); Mayuresh Vartak, Sunnyvale, CA (US); Mallikarjunan Mahalingam, Cupertino, CA (US); Krishna Yadappanavar, Saratoga, CA (US)

(73) Assignee: Cisco Technology, Inc., San Jose, CA (US)

( * ) Notice: Subject to any disclaimer, the term of this patent is extended or adjusted under 35 U.S.C. 154(b) by 15 days.

(21) Appl. No.: 16/030,069

(22) Filed: Jul. 9, 2018

(65) Prior Publication Data

US 2020/0012564 A1    Jan. 9, 2020

(51) Int. Cl.
*G06F 11/10* (2006.01)
*G06F 3/06* (2006.01)
*H03M 13/15* (2006.01)

(52) U.S. Cl.
CPC ........ *G06F 11/1076* (2013.01); *G06F 3/0619* (2013.01); *G06F 3/0659* (2013.01); *G06F 3/0689* (2013.01); *H03M 13/154* (2013.01)

(58) Field of Classification Search
CPC .. G06F 11/1076; G06F 3/0619; G06F 3/0659; G06F 3/0689; H03M 13/154
See application file for complete search history.

(56) References Cited

U.S. PATENT DOCUMENTS 6,985,937 B1   1/2006   Keshav
7,236,966 B1   6/2007   Jackson
(Continued)

OTHER PUBLICATIONS

Rosenblum, et al., "The Design and Implementation of a Log-Structured File System," Jul. 24, 1991, Proceedings of the 13th ACM Symposium on Operating Systems Principles and the Feb. 1992 ACM Transactions on Computer Systems, 15 pages.
(Continued)

*Primary Examiner* — Kyle Vallecillo
(74) *Attorney, Agent, or Firm* — Edell, Shapiro & Finnan, LLC

(57) ABSTRACT

Presented herein are methodologies for implementing erasure coding in a distributed log structured storage system. A method includes receiving a write request for first data from a file system, selecting a physical sector on a selected storage device in an array of storage devices on which to store the first data, assigning a key to the physical sector, storing the key and an indication of the physical sector in a key-to-physical medium map, erasure coding the data, including generating parity data associated with the first data, writing the first data and the parity data as a data stripe to each storage device in the array of storage devices and, in response to receiving the write request, sending the key to the file system. Read, update, and delete procedures in the context of a log structured framework are also described.

17 Claims, 10 Drawing Sheets

(56) References Cited

U.S. PATENT DOCUMENTS

| | | |
|---|---|---|
| 8,010,509 B1 | 8/2011 | Khurama et al. |
| 8,204,859 B2 | 6/2012 | Ngo |
| 8,527,544 B1* | 9/2013 | Colgrove ............. G06F 3/0608 707/791 |
| 8,775,861 B1 | 7/2014 | Raizen |
| 8,793,373 B2 | 7/2014 | Nakama |
| 8,996,614 B2 | 3/2015 | Choudary et al. |
| 9,092,290 B1 | 7/2015 | Bono et al. |
| 9,280,591 B1* | 3/2016 | Kharatishvili .......... G06F 16/27 |
| 9,507,843 B1* | 11/2016 | Madhavarapu ..... G06F 16/2358 |
| 9,519,664 B1* | 12/2016 | Kharatishvili ........ G06F 16/316 |
| 9,613,120 B1* | 4/2017 | Kharatishvili ...... G06F 16/2358 |
| 9,842,031 B1* | 12/2017 | Kharatishvili ...... G06F 11/1474 |
| 2001/0052073 A1 | 12/2001 | Kern et al. |
| 2002/0165961 A1 | 11/2002 | Everdell et al. |
| 2003/0014599 A1 | 1/2003 | McBrearty et al. |
| 2003/0189930 A1 | 10/2003 | Terrell et al. |
| 2005/0108593 A1 | 5/2005 | Purushothaman et al. |
| 2005/0268054 A1 | 12/2005 | Werner et al. |
| 2007/0220059 A1 | 9/2007 | Lu et al. |
| 2011/0022566 A1 | 1/2011 | Beaverson et al. |
| 2011/0258480 A1 | 10/2011 | Young et al. |
| 2011/0307736 A1 | 12/2011 | George et al. |
| 2012/0117246 A1 | 5/2012 | Pujolle |
| 2012/0198152 A1 | 8/2012 | Terry et al. |
| 2012/0203825 A1 | 8/2012 | Choudary |
| 2012/0221774 A1 | 8/2012 | Atkisson et al. |
| 2012/0233463 A1 | 9/2012 | Holt et al. |
| 2012/0233668 A1 | 9/2012 | Leafe et al. |
| 2012/0254269 A1 | 10/2012 | Carmichael |
| 2012/0260037 A1 | 10/2012 | Jibbe et al. |
| 2012/0278512 A1 | 11/2012 | Alatorre et al. |
| 2012/0303999 A1 | 11/2012 | Calder et al. |
| 2013/0042052 A1* | 2/2013 | Colgrove ............. G06F 3/0608 711/103 |
| 2013/0046949 A1* | 2/2013 | Colgrove ............. G06F 3/0608 711/170 |
| 2013/0086353 A1* | 4/2013 | Colgrove ............. G06F 3/0608 711/206 |
| 2013/0275391 A1* | 10/2013 | Batwara ................ G06F 16/125 707/689 |
| 2013/0275656 A1* | 10/2013 | Talagala .............. G06F 12/0246 711/103 |
| 2014/0122795 A1 | 5/2014 | Chambliss |
| 2014/0164621 A1 | 6/2014 | Nakama |
| 2014/0325115 A1* | 10/2014 | Ramsundar ......... G06F 12/0238 711/102 |
| 2015/0039717 A1 | 2/2015 | Chiu et al. |
| 2016/0054920 A1* | 2/2016 | Patterson, III ........ G06F 3/0604 714/766 |
| 2016/0054939 A1* | 2/2016 | Wang, III ........... G06F 11/1076 711/154 |
| 2016/0055054 A1* | 2/2016 | Patterson, III ...... G06F 11/1076 714/6.2 |
| 2017/0242626 A1* | 8/2017 | O'Krafka ................ G06F 3/064 |
| 2018/0074746 A1* | 3/2018 | Watanabe ............. G06F 3/0608 |
| 2019/0034087 A1* | 1/2019 | Renauld ................ G06F 3/0689 |
| 2019/0165810 A1* | 5/2019 | Tseng ................. H03M 13/1122 |

OTHER PUBLICATIONS

Patterson, et al., "A Case for Redundant Arrays of Inexpensive Disks (RAID)," SIGMOD '88 Proceedings of the 1988 ACM SIGMOD International Conference on Management of Data, Jun. 1988, 8 pages.

Andersen, et al., "FAWN: A Fast Array of Wimpy Nodes," SOSP'09, Oct. 11-14, 2009, 17 pages.

Bohossian, et al., "Computing in the RAIN: A Reliable Array of Independent Nodes," Sep. 24, 1999, Published in IEEE Transactions on Parallel and Distributed Systems, vol. 12, Issue 2, Feb. 2001, 21 pages.

VMware, "VMware® Virtual SAN™ Hardware Guidance," Technical Marketing Documentation, V. 1.0, Technical White Paper, Apr. 2014, 10 pages.

DeepStorage, "The Case for Persistent Full Clones, A better alternative to linked clones for VDI," A DeepStorage Technology Report, http://www.deepstorage.net/NEW/new-report-the-case-for-persistent-full-clones-a-better-alternative-to-linked-clones-for-vdi/, May 2013, 18 pages.

RODEH, "B-trees, Shadowing, and Clones," http://usenix.org/event/lsf07/tech/rodeh.pdf, Feb. 2007, 51 pages.

RODEH, "B-trees, Shadowing, and Clones," ACM Transactions on Computational Logic, vol. V, No. N, Aug. 2007, 26 pages.

\* cited by examiner

SYSTEM AND METHOD FOR INLINE ERASURE CODING FOR A DISTRIBUTED LOG STRUCTURED STORAGE SYSTEM

TECHNICAL FIELD

The present disclosure relates to fault tolerant data storage and backup systems.

BACKGROUND

Enterprise storage systems currently available are typically proprietary storage appliances that integrate the storage controller functions and the storage media into the same physical unit. This centralized model makes it harder to independently scale the storage systems' capacity, performance and cost. Users can get tied to one expensive appliance without the flexibility of adapting it to different application requirements that may change over time. For small and medium scale enterprise, this may require substantial upfront capital cost. For larger enterprise datacenters, new storage appliances are added as the storage capacity and performance requirements increase. These appliances may operate in silos and impose significant management overhead.

DESCRIPTION OF EXAMPLE EMBODIMENTS

Overview

Presented herein are techniques for a distributed storage system implementing erasure coding. A method includes receiving a write request for first data from a file system, selecting a physical sector on a selected storage device in an array of storage devices on which to store the first data, assigning a key to the physical sector, storing the key and an indication of the physical sector in a key-to-physical medium map, erasure coding the data, including generating parity data associated with the first data, writing the first data and the parity data as a data stripe to each storage device in the array of storage devices and in response to receiving the write request, sending the key to the file system.

A device or apparatus is also described. The device may include an interface unit configured to enable network communications, a memory, and one or more processors coupled to the interface unit and the memory, and configured to: receive a write request for first data from a file system, select a physical sector on a selected storage device in an array of storage devices on which to store the first data, assign a key to the physical sector, store the key and an indication of the physical sector in a key-to-physical medium map, erasure code the data, including generating parity data associated with the first data, write the first data and the parity data as a data stripe to each storage device in the array of storage devices, and in response to receipt of the write request, send the key to the file system.

Example Embodiments

Figure 1:
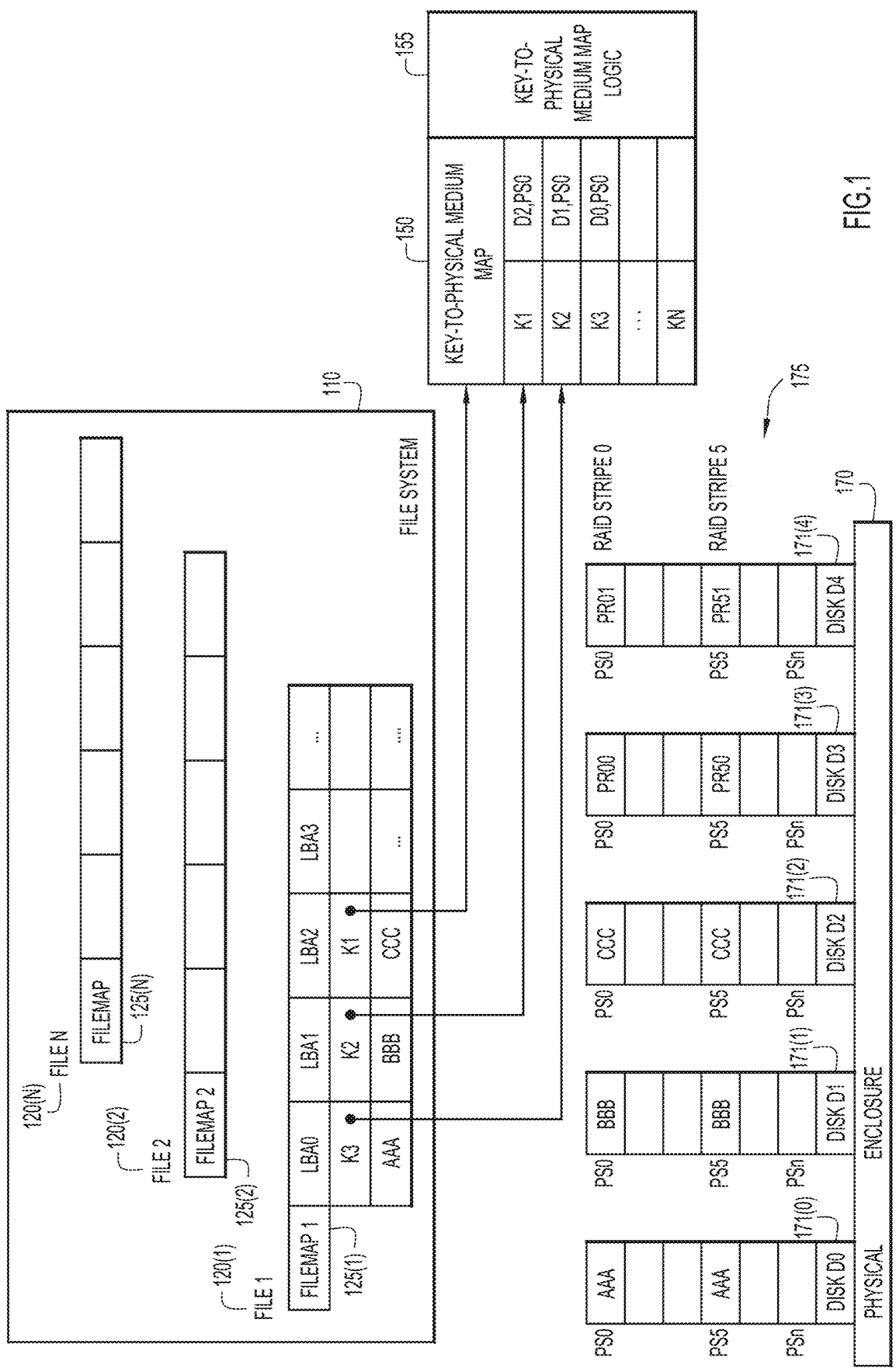
FIG. 1 depicts a first embodiment of an array of disks that provides erasure coded data storage for a file system in accordance with an example embodiment.

FIG. 1 depicts a first embodiment of an array of disks that provides erasure coded data storage for a file system in accordance with an example embodiment. Specifically, FIG. 1 shows a file system 110 that includes a plurality of files 120(1), 120(2), 120(N), each including a respective file map 125(1), 125(2), 125(N). Each of the file maps, e.g., file map 125(1), includes a series of logical block addresses (LBAs) that correspond to data that is stored on a storage medium 175. In this case, the individual blocks of data are "AAA", "BBB" and "CCC" corresponding to, or pointed to by, LBA0, LBA1, and LBA2, respectively.

The storage medium 175 may be, e.g., one or more disk drives 171(0), 171(1), 171(2), 171(3), 171(4) in an enclosure 170. That is, each LBA in a given file map, e.g., file map 125(1), is associated with a physical sector (PS) on a given disk. For example, LBA0 in file map 125(1) corresponds to data "AAA", which is stored at physical sector 0 (PS0) of disk 171(0). LBA1 in file map 125(1) corresponds to data "BBB", which is stored at physical sector 0 (PS0) of disk 171(1). LBA2 in file map 125(1) corresponds to data "CCC", which is stored at physical sector 0 (PS0) on disk 171(2).

In accordance with embodiments described herein, the storage medium 175 may be configured as a redundant array of disk (RAID) system implementing an erasure coding scheme for data recovery in the event a given disk drive in the RAID system becomes unavailable. All of the disks may be housed in a single enclosure 170. Thus, as shown in FIG. 1, not only are physical sectors 0 on disks 171(0), 171(1), 171(2) configured to store data "AAA," "BBB" and "CCC," respectively, but physical sectors 0 of disks 171(3), 171(4) are further configured to store parity data PR00, PR01, respectively, that enable the erasure coding scheme to, in the case shown with five disks, to lose any two disks and still recover any data in a given stripe of data (i.e., RAID stripe 0, the data stored across physical sectors 0 of all the disks).

In order for, e.g., the file map 125(1) to access data corresponding to any one of its LBAs, a disk and physical sector number is needed. In a typical file system, the file map itself stores the relevant disk and physical sector number to locate the desired data in the storage medium. However, in a RAID system that implements erasure coding, the file system 110 could be subjected to a significant number of updates. For example, consider an event that would cause RAID stripe 0 to be moved to e.g., RAID stripe 5 in FIG. 1. As will be appreciated by those skilled in the art, all of the physical sector numbers (PS0s) that would be stored in a given file map, would then have to be changed, in this case, to PS5's for each of LBA0, LBA2, and LBA2. Such file system updating can quickly become burdensome to the file system 110 and bog down the overall efficiency of a related computing system (shown in FIG. 9). That is, storage medium 175, configured as a RAID system, can cause file system 110 to have to update itself as a result of changes occurring in the storage medium 175, but that are unrelated to the file system 110. This can unduly burden the file system 110.

To address this issue, embodiments described herein provide an improved file system interaction approach by providing an intermediary mapping scheme that is logically disposed between the file system 110 and the storage medium 175 and that takes care of monitoring and adapting to changes occurring in the storage medium 175. Specifically, a key-to-physical medium map 150 is arranged as a key-value index. The "key" component of the key-value index is unique, and may be generated via a monotonically increasing sequence. The "value" component of the key-value index may be the disk number and physical sector of where given data is stored in the storage medium 175. For example, and still referring to FIG. 1, key K1 is associated with D2 (171(2)) and PS0, which correspond to data "CCC". As such, K1 is stored in association with LBA2 in file map 125(1). Similarly K2 is associated with D1 (171(1)) and PS0, which correspond to data "BBB". As such, K2 is stored in association with LBA1 in file map 125(1). Likewise, K3 is associated with D0 (171(0)) and PS0, which correspond to data "AAA". As such, K3 is stored in association with LBA0 in file map 125(1).

In an embodiment, key-to-physical medium map logic 155 is provided in connection with key-to-physical medium map 150 and is configured to, among other things, generate the keys (e.g., monotonically, or via a unique fingerprint based on the data being stored), provide respective keys to file system 110 when file system requests a data write, and act as an intermediary between the file system 110 and storage medium 175 when the file system 110 makes a read request for data stored in the storage medium 175.

Thus, as shown in FIG. 1, there is provided an array of physical storage devices configured to store segments of data in a striping fashion across the array, and a key-to-physical medium map configured to associate a key to (i) a given storage device in the array of physical storage devices and (ii) a given physical sector on the given storage device. Key-to-physical medium map logic 155 is configured to generate the key, supply the key to a file map of a file system and act as an intermediary between the file system and the storage medium in connection with data read requests and data write requests based on the key.

With a system configured as shown in FIG. 1, only the key-to-physical medium map 150 needs to be updated when, e.g., a RAID stripe is moved in the storage medium. That is, the keys themselves would not change, and as such, no changes are needed in the file maps 120(1), 120(2), 120(N) of the file system 110. Instead, the "value" pointed to by the keys (i.e., disk number and physical sector) configured as the key-to-physical storage medium map 150 would change, thus enabling the file system to still access the correct data despite a RAID stripe move.

Another advantage of implementing the key-to-physical medium map 150 as disclosed herein is that a given key might be used in multiple file maps. For example, K2, which corresponds to a disk and physical sector for the data "BBB", could also be re-used in, e.g., file map 2 125(2), assuming an LBA in file map 2 125(2) also was associated with data "BBB".

While the configuration shown in FIG. 1 provides significant advantages over conventional systems by masking data movement occurring in the storage medium 175 from the file system 110, the key-to-physical medium map 150, itself, may be considered a single point of failure, thus undercutting the fault tolerance advantages of the RAID system configured with an erasure coding scheme.

Figure 2:
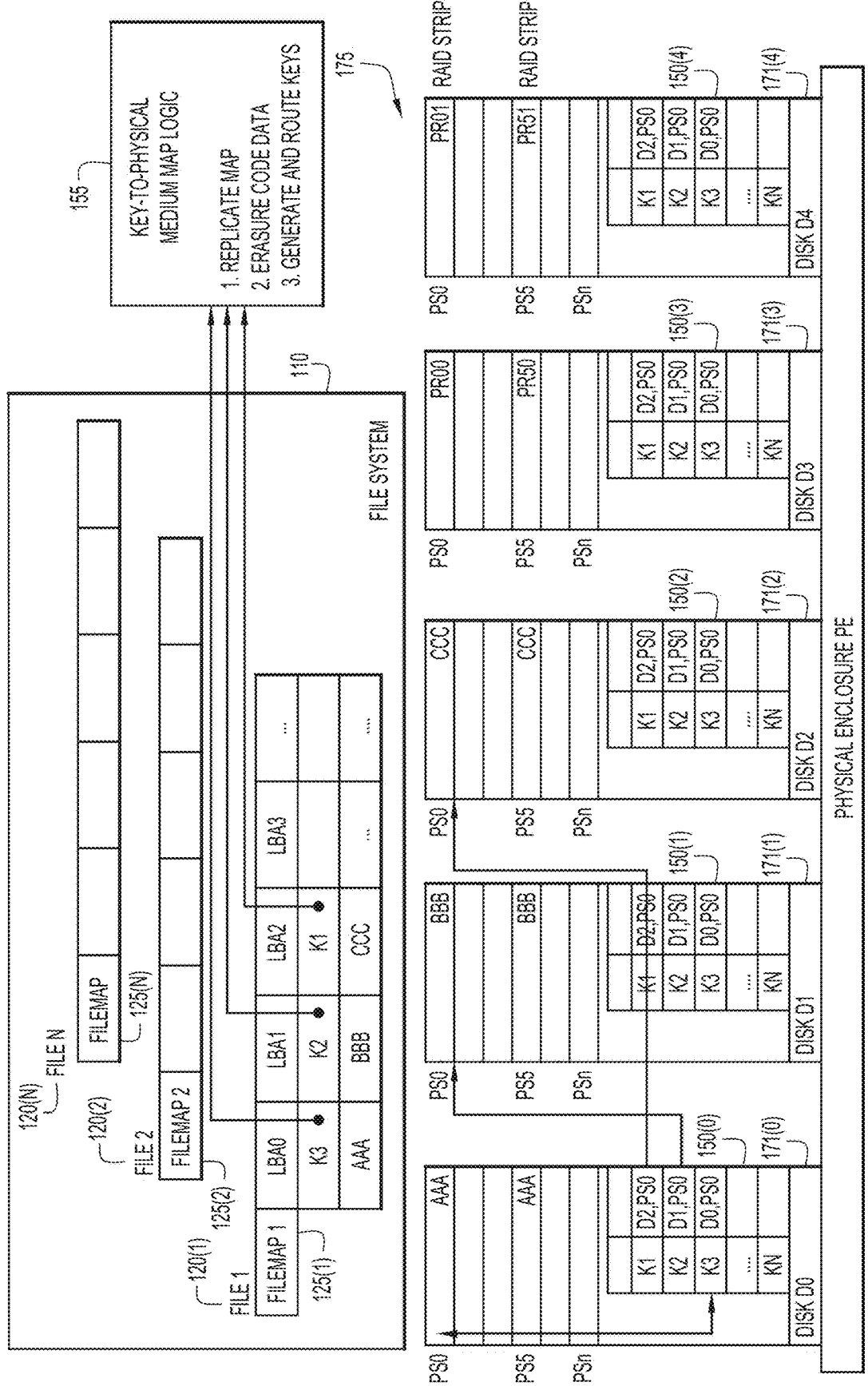
FIG. 2 depicts a second embodiment of an array of disks that provides erasure coded data storage for a file system in accordance with an example embodiment.

FIG. 2 depicts a second embodiment of an array of disks that provides erasure coded data storage for a file system in accordance with an example embodiment. FIG. 2 is similar to FIG. 1, except the key-to-physical medium map 150, instead of being saved in a single location associated with key-to-physical medium map logic 155, is saved or replicated to each of the disks 171(0), . . . , 171(4). In this way, the key-to-physical medium map 150 is no longer a single point of failure. Even if one of the disks 171(0) . . . , 171(4) were to become unavailable, the entire key-to-physical medium map 150 would still be available on one or more other disks.

Also shown in FIG. 2 is additional functionality associated with key-to-physical medium map logic 155. Key-to-physical medium map logic 155 may be configured to (1) replicate the key-to-physical medium map 150 to each disk 171(0), . . . , 171(4), (2) erasure code data that is written to the disks 171(0), . . . , 171(4), i.e., compute the parity data (e.g., PR00, PR01, PR50, PR51) that complements "AAA," "BBB," and "CCC" in the instant example, and (3) generate and route keys to the file system 110.

In the embodiment of FIG. 2, it is noted that the key-to-physical medium map logic 155 is still a standalone element, and thus it, too, can function as a single point of failure.

Figure 3:
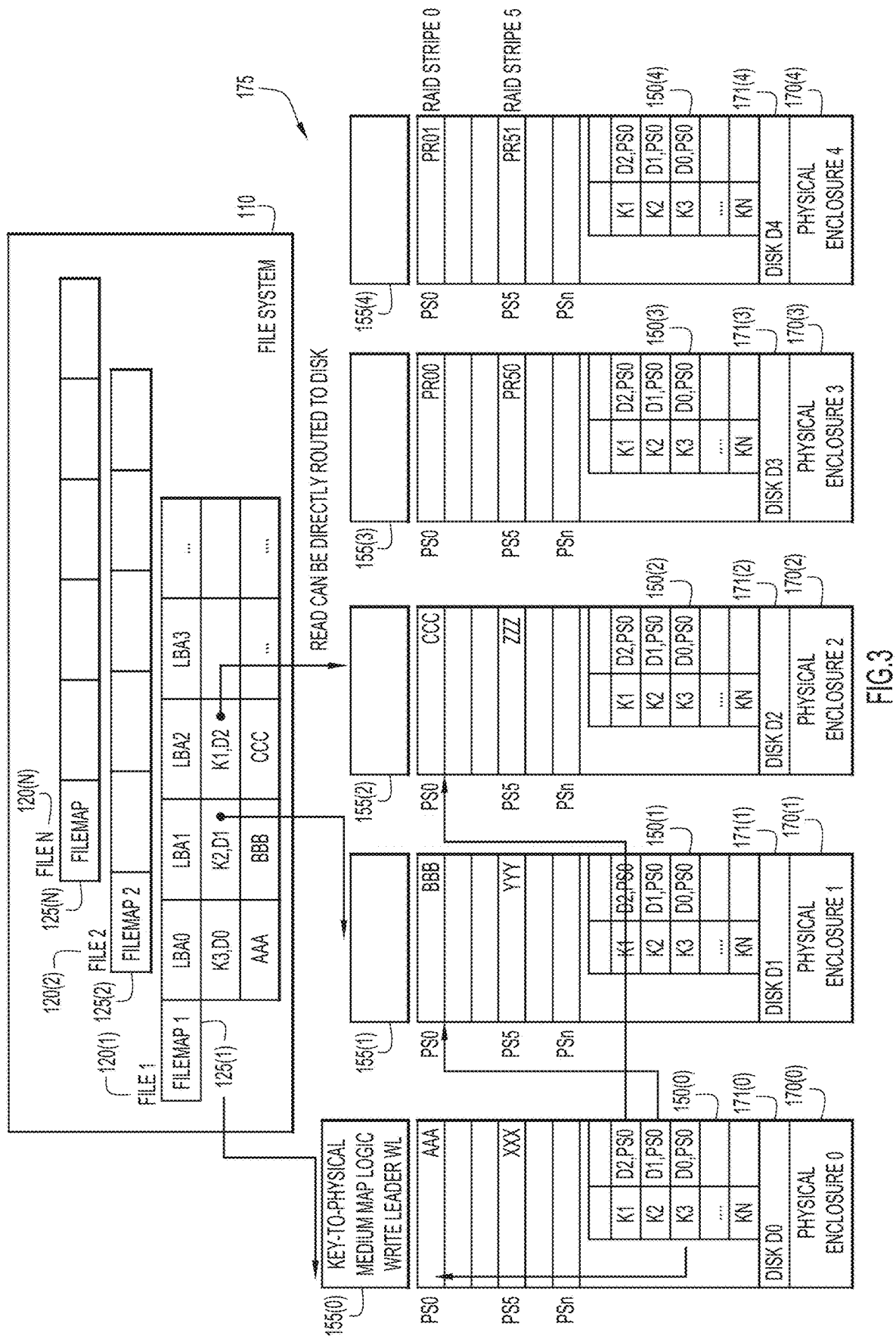
FIG. 3 depicts a third embodiment of an array of disks that provides erasure coded data storage for a file system in accordance with an example embodiment.

To address this other potential single point of failure issue, FIG. 3 depicts a third embodiment of an array of disks that provides erasure coded data storage for a file system in accordance with an example embodiment. In FIG. 3, the key-to-physical medium map logic 155 is also distributed to each of the disks 171(0), . . . , 171(4) as key-to-physical medium map logic 155(0), 155(1), 155(2), 155(3), 155(4). By moving the key-to-physical medium map logic 155 to be instantiated on each respective disk enclosure/controller module 170(0), . . . , 170(4), the key-to-physical medium map logic 155 also becomes fault tolerant. A by-product of the distributed nature of the key-to-physical medium map logic 155 functionality is that each disk 171(0), . . . , 171(4) can now also be in its own respective enclosure 170(0), 170(1), 170(2), 170(3), 170(4). That is, each disk, even in a RAID arrangement, need not be tied to the same enclosure (where "same enclosure" may be defined as being powered from a same source). As a result, disks, even running in a RAID arrangement, may be physically distributed, providing still more fault tolerance.

As a further enhancement, FIG. 3 also shows that the file map system may be provided with a disk reference or, more generally, a token, which may be opaque, i.e., not have any explicit meaning, in addition to a key. For example, LBA0 in FIG. 3 stores K3 and D0 171(0). When this information, in connection with a read request from the file system 110, is sent to the multiple respective enclosures 170(0), 170(1), 170(2), 170(3), 170(4), each enclosure can determine whether it contains the storage medium or disk from which the data ("AAA") is being sought. Alternatively, this functionality can also be performed by each instance of key-to-physical medium map logic 155(0), 155(1), 155(2), 155(3), 155(4). In still another embodiment, the key is routed directly to disk 0, 171(0). By providing a "hint" as to which storage device is being targeted, the non-targeted storage devices need not waste time looking up a key in their respective key-value indexes (key-to-physical medium map 150(0), etc.), only to realize the data being sought is resident on another disk. In this particular case, key-to-physical medium map logic 155(0) looks up K3 in its copy of the key-to-physical medium map 150(0) to determine that physical sector 0 (PS0) is being sought. PS0 contains "AAA," and that data is then returned to the file system 110 in response to its read request.

For completeness, LBA1 stores K2, D1, which points to disk 171(1) and PS0, and thus data "BBB." LBA2 stores K1, D2, which points to disks 171(2) and PS0, and thus data "CCC."

A write request to the storage system may also be handled in a unique fashion. Because the key-to-physical medium map logic 155 may be distributed as shown in FIG. 3, only one of the key-to-physical medium map logic 155(0), 155(1), 155(2), 155(3), 155(4) instantiations is selected, at a given time, as a "write leader" (WL) so that the multiple instantiations of key-to-physical medium map logic are not colliding with each other for the same storage medium resources upon receiving a write request from the file system 110. In an embodiment, a distributed write leader election algorithm is used to select one instantiation among the key-to-physical medium map logic 155(0), 155(1), 155(2), 155(3), 155(4) instantiations. The selected instantiation becomes the WL. All writes to all disks for a given stripe are then performed "through" the selected WL.

In an embodiment, the WL buffers and collects enough writes to fill a given stripe. If the data is not sufficient to fill a full stripe, zeros may be added/padded. The WL then calculates the parity bits for the full stripe. The WL then further generates key updates that are needed to store the stripe. The WL then executes a commit data function, which stores the data and keys on each physical enclosure. Once all the data and keys are deemed to have been successfully persisted by each of the disks, the writes are acknowledged, via the WL, to the file system 110. In the embodiment shown in FIG. 3, the WL is shown as key-to-physical medium map logic 155(0). However, at any given time, any one of the key-to-physical medium map logic instantiations can function as the write leader when elected.

Figure 4:
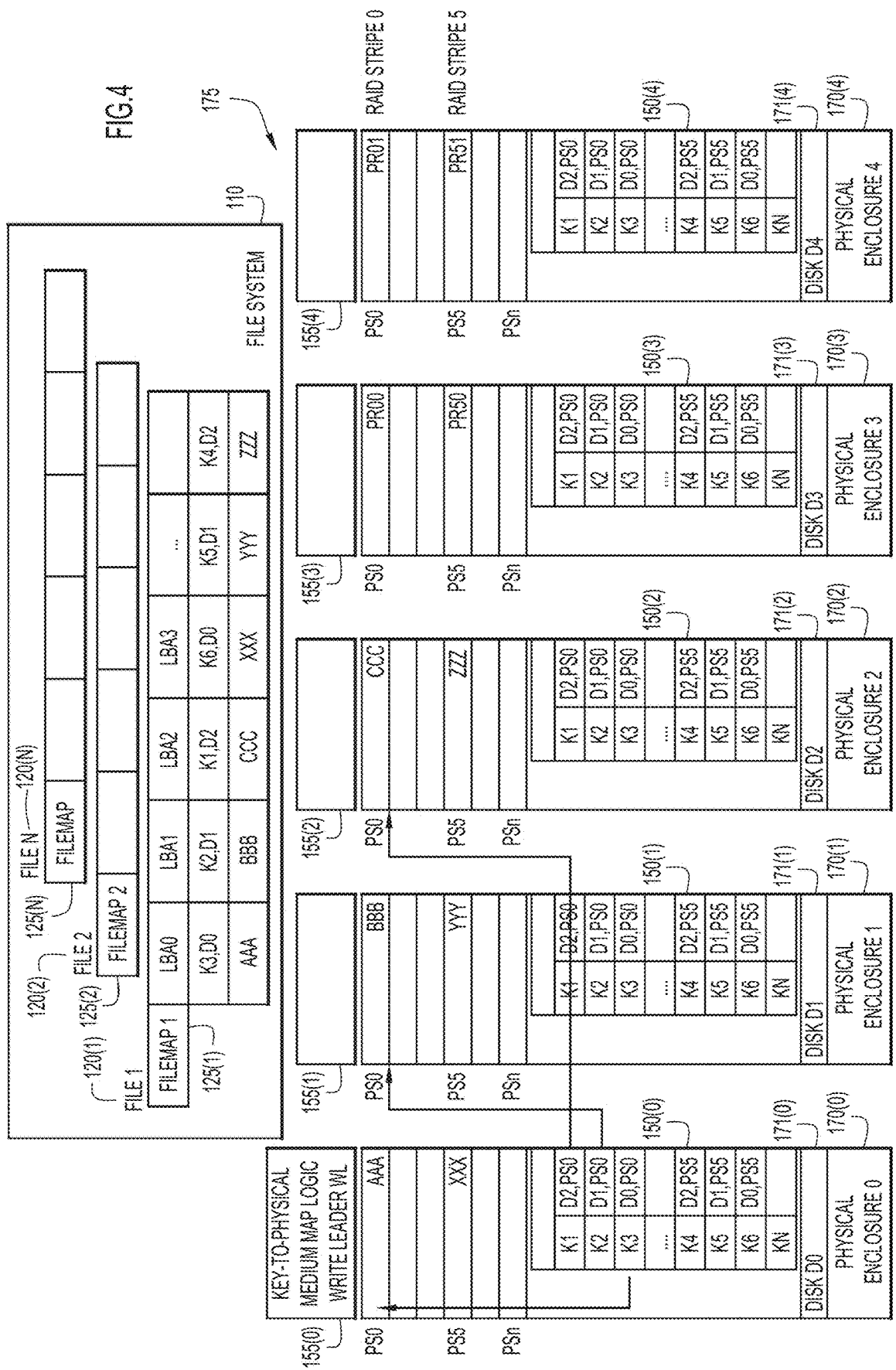
FIG. 4 depicts a state of an array of disks after a given erasure coded RAID stripe has been written in accordance with an example embodiment.

As an example of the foregoing, FIG. 4 depicts a state of an array of disks after a given erasure coded RAID stripe has been written in accordance with an example embodiment. More specifically, in the example shown, RAID stripe 5 is updated. In this example, key-to-physical medium map logic 155(0) functions as the write leader. As such, it collects data "XXX," "YYY" and "ZZZ" that are to be written to the storage medium 175. Key-to-physical medium map logic 155(0) calculates parity bits PR50, PR51. Key-to-physical medium map logic 155(0) then assign keys to the data items "XXX," "YYY" and "ZZZ". As a result of the foregoing operations, the following payload may be generated by key-to-physical medium map logic 155(0):

```
StripeUpdatePacket = {
    Data {XXX, YYY, ZZZ}
    Parity {PR50, PR51}
    Keys = {
        K4 = D0,PS5
        K5 = D1, PS5
        K6 = D2, PS5
    }
}
```

The above StripeUpdatePacket is then delivered to all enclosures (i.e., disks) in the update, namely 170(0), 170(1), 170(2), 170(3), 170(4), via a network.

Each enclosure 170(0), 170(1), 170(2), 170(3), 170(4) then updates the stripe data for the keys it owns, and updates its key-to-physical medium map 150(0), 159(1), 150(2), 150(3), 150(4) such that all keys including new keys K4, K5, K6, corresponding tokens and physical sector numbers. Each enclosure 170(0), 170(1), 170(2), 170(3), 170(4) then acknowledges the success of the write, as well as the key-to-physical medium map updates. The WL, in this case key-to-physical medium map logic 155(0), then acknowledges a write success back to file system 110.

Figure 5:
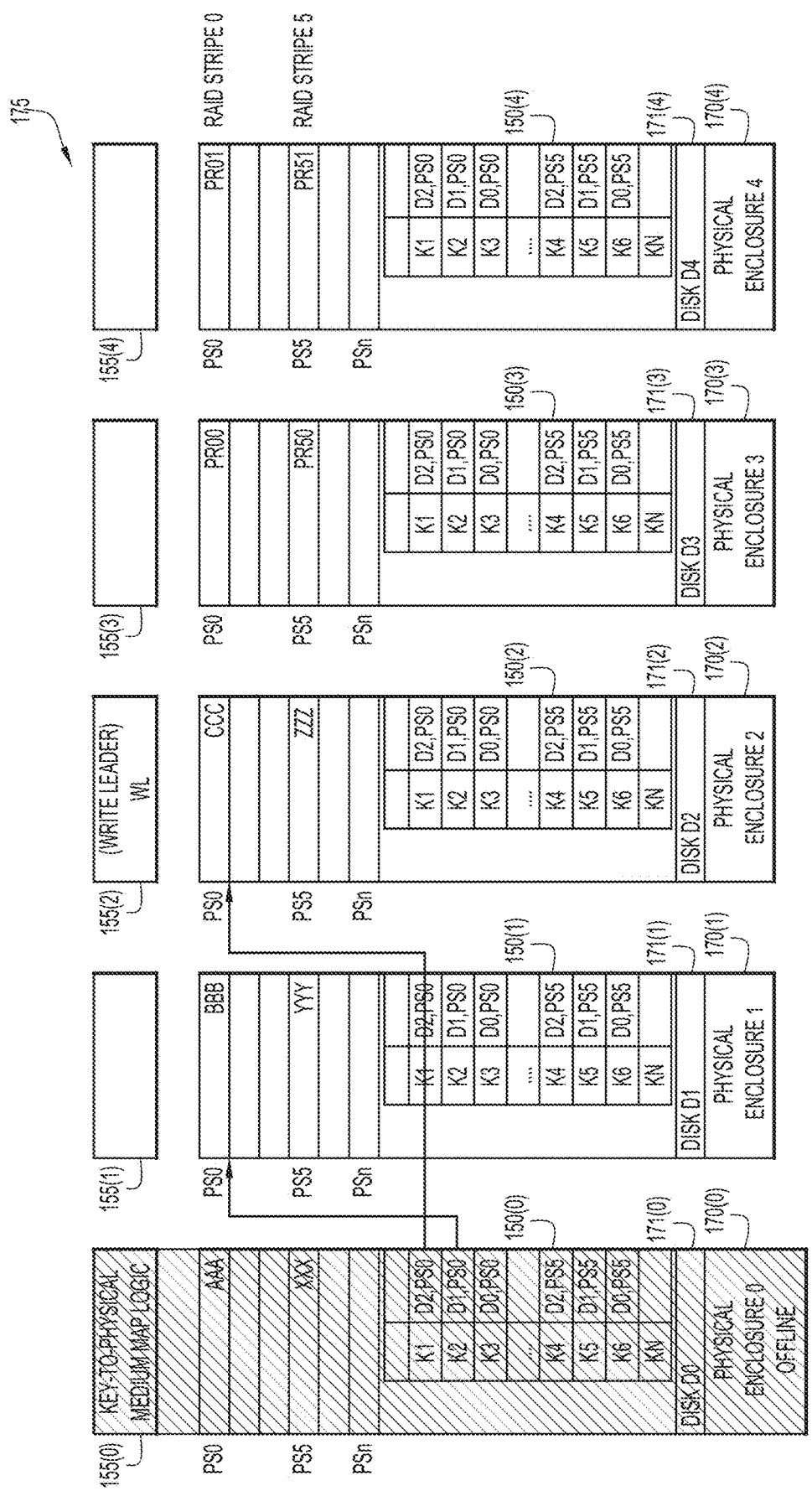
FIG. 5 depicts a state of an array of disks in connection with a write procedure when one disk is offline in accordance with an example embodiment.

FIG. 5 depicts a state of an array of disks in connection with a write procedure when one disk is offline in accordance with an example embodiment. As shown, physical enclosure 170(0) is offline. Thus, any read or write request to that enclosure or its disk D0 171(0) will fail. Also, the WL, key-to-physical medium map logic 155(0), will not function in such a state. To address this situation, a new write leader is selected. In this case, key-to-physical medium map logic 155(2) is selected. If more than a maximum number of enclosures are offline (beyond just, e.g., 170(0)) such that given data cannot be recovered through erasure coded recovery mechanisms, then a write fail may be returned to the file system 110. Assuming a sufficient number of enclosures are operating, the write request is issued to the WL, key-to-physical medium map logic 155(2). A StripeUpdatePacket is then generated and sent to all active/alive enclosures. Once enough enclosures have acknowledged the write has been successfully persisted, the write request is acknowledged back to filesystem 110.

Reference is also made to FIG. 5 in connection with a read request that ends up being targeted for an offline disk drive, in this case D0, 171(0). Assume a user wants to read LBA0 of file 1 120(1). The file system 110 refers to filemap1 125(1), and determines the key required to serve LBA0 for file1, namely "K3, D0" (see, e.g., FIG. 4). The read request is initiated while physical enclosure 0 170(0) is offline, and thus the read request is routed to physical enclosure 0, 170(0). The file system 110 detects that physical enclosure 0, 170(0) is not accessible and thus redirects the read request to write leader 2, namely key-to-physical medium map logic 155(2). In one possible implementation, write leader election is performed and the result is provided to the file system. In another possible implementation, the leader election process is deterministic such that, e.g., the lowest numbered available enclosure becomes the leader. Key-to-physical medium map logic 155(2) looks up K3 in its key-to-physical medium map 150(2) and learns that the data being sought is stored on D0, 171(0). In one embodiment, each instance of key-to-physical medium map logic 155, i.e., 155(0), 155(1). 155(2), 155(3), 155(4) is aware through, e.g., a heartbeat mechanism, which of the instances is operational. With such functionality, key-to-physical medium map logic 155(2) knows that enclosure 170(0) may be unavailable, and thus infers that RAID stripe 0 has to be reconstructed using the, e.g., the parity data stored in the stripe. That is, key-to-physical medium map logic 155(2) reconstructs D0, PS0 from the RAID stripe [D1,PS0][D2,PS0][D3,PS0][D4,PS0]. As such, data "AAA" is reconstructed and returned to the file system 110 by key-to-physical medium map logic 155(2), even though the data being sought was originally stored in physical enclosure 0, 170(0).

Next is described what occurs when a physical enclosure comes back online after having been offline for some period of time. In this case, and still referring to FIG. 5, it is assumed that physical enclosure 0, 170(0) was temporarily offline and the system continued to operate, including storing RAID stripe 5. Physical enclosure 0, 170(0) then comes back online, key-to-physical medium map logic 155(0) on physical enclosure 0, 170(0) looks at its copy of the key-to-physical medium map 150(0) and compares it with any active key-to-physical map 150 in the system, e.g., key-to-physical medium map 150(1). Key-to-physical medium map logic 155(0) can quickly infer that its key-to-physical medium map 150(0) is missing keys K4, K5, K6 as they are present on key-to-physical medium map 150(1), but not in its own key-to-physical medium map 150(0). Key-to-physical medium map logic 155(0) infers that it is responsible for K6→D0, PS5. As such, key-to-physical medium map logic 155(0) reconstructs D0, PS5 contents→XXX by reading RAID Stripe 5. Key-to-physical medium map logic 155(0) writes "XXX" to D0, PS5 and also updates key-to-physical medium map 150(0) to host K4, K5, K6.

Figure 6A:
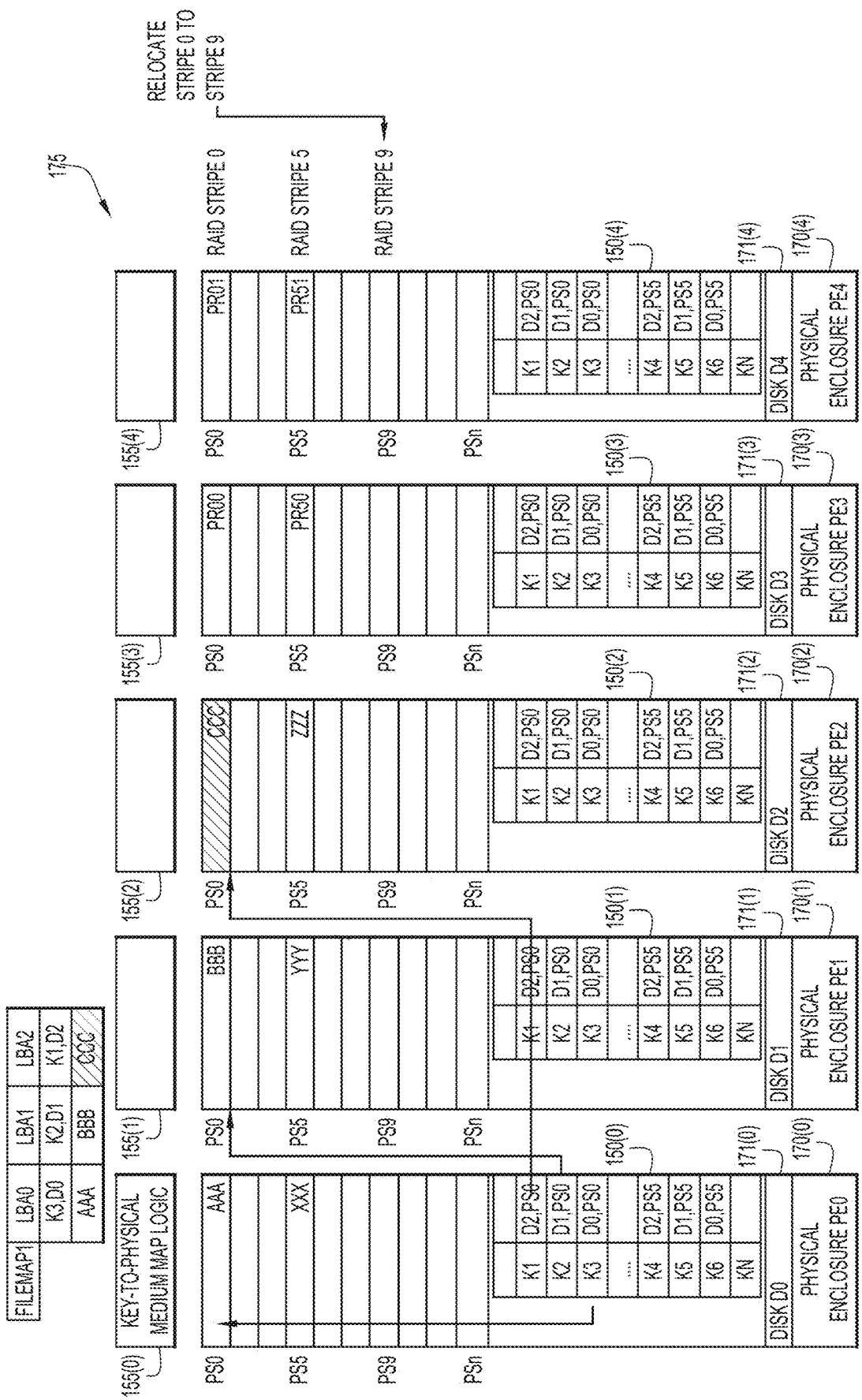
FIGS. 6A, 6B and 6C depict states of an array of disks in connection with a RAID stripe relocation in accordance with an example embodiment.
Figures 6B, 6C:
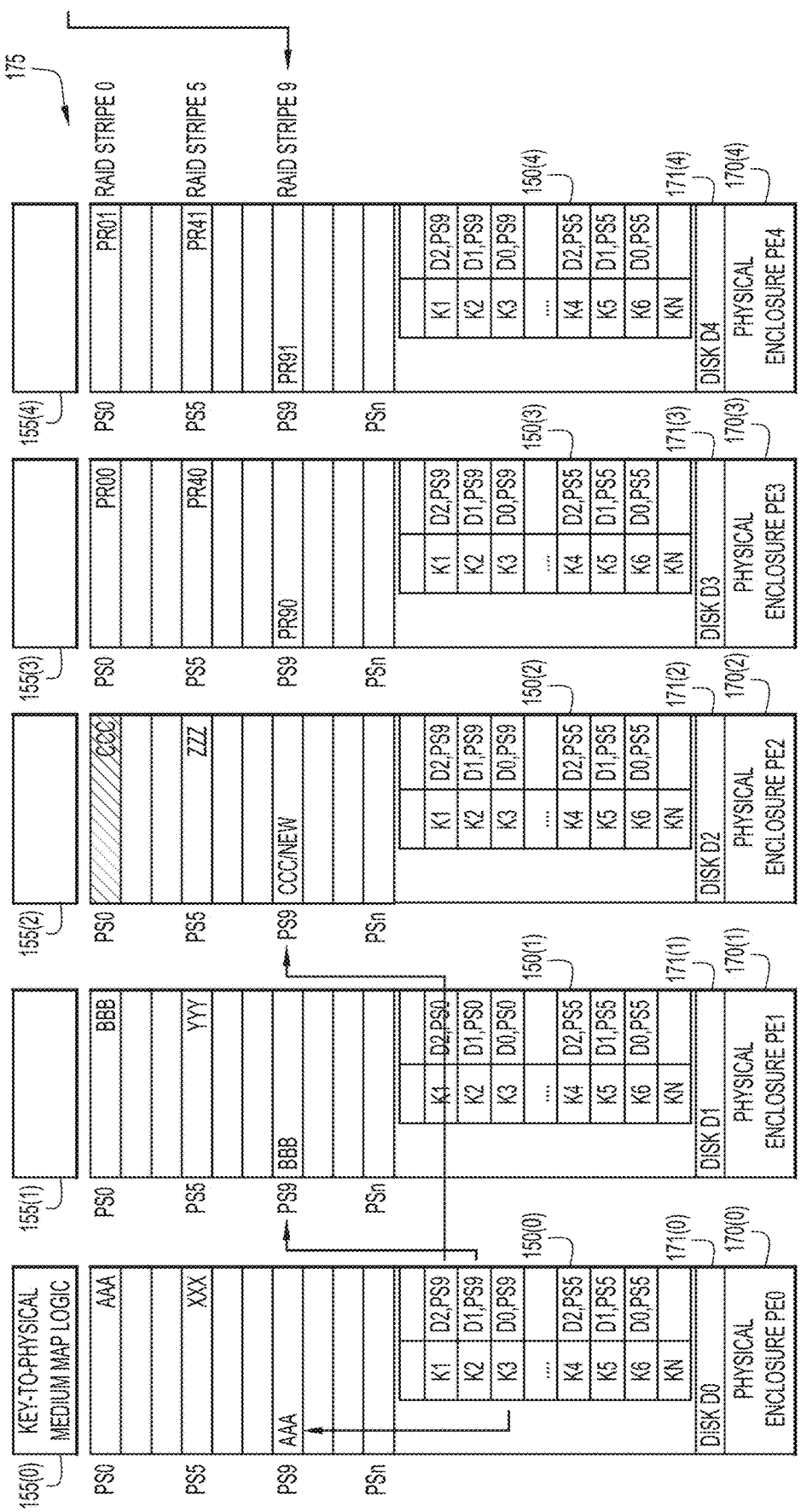

FIGS. 6A and 6B depict states of an array of disks in connection with a RAID stripe relocation in accordance with an example embodiment. There are at least two instances in which it may be desirable to rewrite or relocate a given stripe in storage medium 175. In a first instance, errors may be detected at a sector, e.g., physical sector 0, on D2, 171(2) (such that data "CCC" can longer be read correctly). In a second instance, K1, to with which data "CCC" is associated, is no longer referred to by the file system 110. That is, data "CCC" is no longer needed, and that sector could be freed up as part of a garbage collection routine. Moving or relocating a given RAID stripe can address both of the foregoing instances. In FIGS. 6A and 6B, RAID stripe 0 is moved to RAID stripe 9. The key-to-physical medium maps 150(0), . . . , 150(4) are also updated accordingly.

More specifically, in the example of FIGS. 6A and 6B, assume that key-to-physical medium map logic 155(0) on physical enclosure 0, 170(0), is acting as write leader, and initiates a relocate for a "source stripe." The source stripe in this case is Stripe 0. In connection with the relocate, key-to-physical medium map logic 155(0) copies all of the contents of the affected stripe, and prepares a new "destination stripe" with the contents of the affected stripe. The destination stripe in FIGS. 6A and 6B is Stripe 9. In preparing the contents, key-to-physical medium map logic 155(0) may need to recover given data that might not be accessible in the source stripe, and can use erasure coding recovery to obtain the desired or missing data.

Key-to-physical medium map logic 155(0) then creates a packet with a payload for the new stripe, including the data for each sector, the parity data, keys, and an indication of the location of the stripe to be relocated (in this case Stripe 0). Key-to-physical medium map logic 155(0) then sends that payload to each of the drives, and further causes the key-to-physical medium maps 150(0), . . . , 150(4) to be updated (FIG. 6C).

In an embodiment, the key-to-physical medium map logic 155 instances running on each of the enclosures 170(0) . . . 170(4) may be configured to delete a source stripe at a future time (i.e., not at the time a destination stripe has been written to). More specifically, once a given stripe is relocated to its destination stripe, the source stripe is not necessarily deleted at the same time. Rather, a given source stripe may be deleted upon receipt of a subsequent stripe write request. That is, receipt of a new packet for another stripe may be considered implied "barrier" beyond which it is guaranteed that the data remapping has materialized and it is safe to delete a prior source stripe. This is why the packet may also contain the indication of the location of the stripe to be relocated (the source stripe). The key-to-physical medium map logic 155 instance maintains a list of stripes to be deleted, and can perform such deletion at a future time, not tied to a given write process. Indeed, source stripes may be deleted in a batch mode using the list of stripes to be deleted.

It should also be noted that data that is stored on a given disk 171 has to stay on that same disk in connection with a stripe relocation, for the token/hint based read routing to work. As noted above with respect to FIG. 3, a given file map may include not only a key, but also a disk number (or other token/hint) that enables a more efficient read operation for the desired data. If data were to move around across disks, then the disk number or token would also have to be updated. Such an operation would involve updating the client data structures pointing to the changed key which would be cumbersome and may slow down the performance of the overall system.

Figure 7:
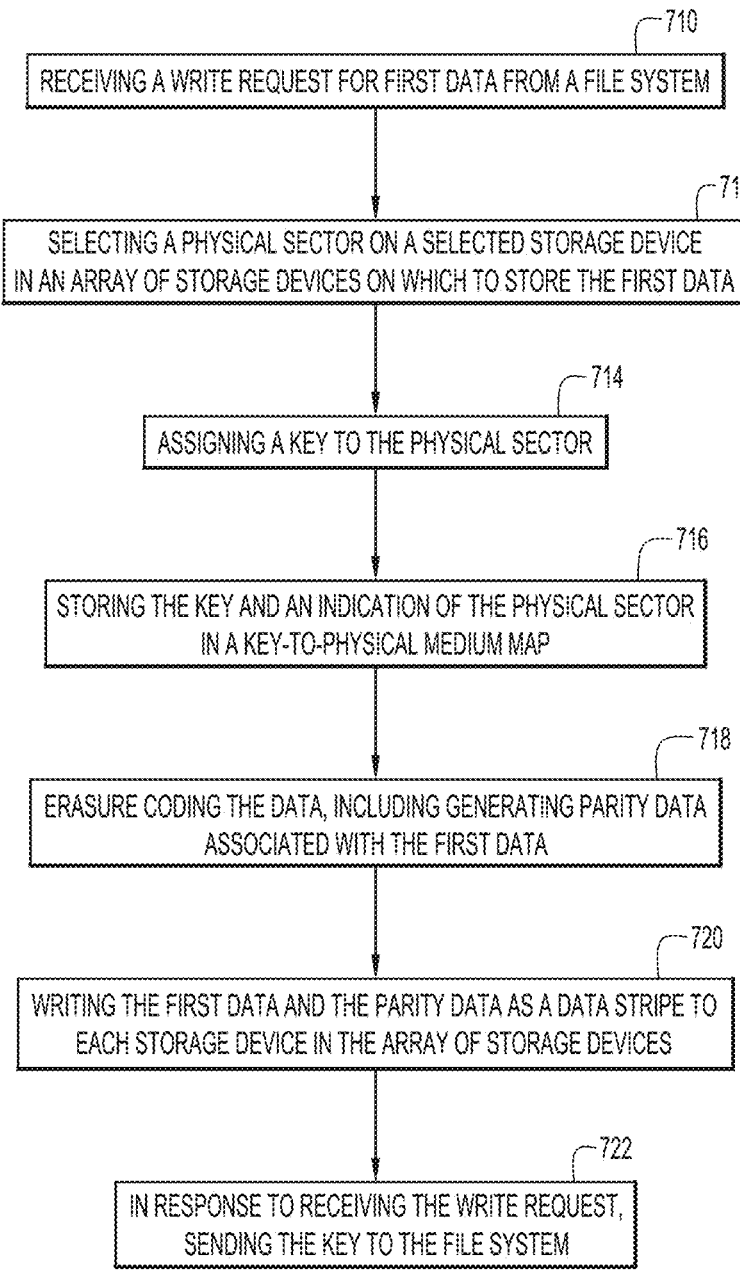
FIG. 7 is a flow chart depicting a series of operations for operating a storage system in accordance with an example embodiment.

FIG. 7 is a flow chart depicting a series of operations for operating a storage system in accordance with an example embodiment. In an embodiment, key-to-physical medium map logic 155 (or any individual instantiation thereof) may be configured to provide operations of receiving a write request for first data from a file system (710), selecting a physical sector on a selected storage device in an array of storage devices on which to store the first data (712), assigning a key to the physical sector (714), storing the key and an indication of the physical sector in a key-to-physical medium map (716), erasure coding the data, including generating parity data associated with the first data (718), writing the first data and the parity data as a data stripe to each storage device in the array of storage devices (720), and in response to receiving the write request, sending the key to the file system (722).

Figure 8:
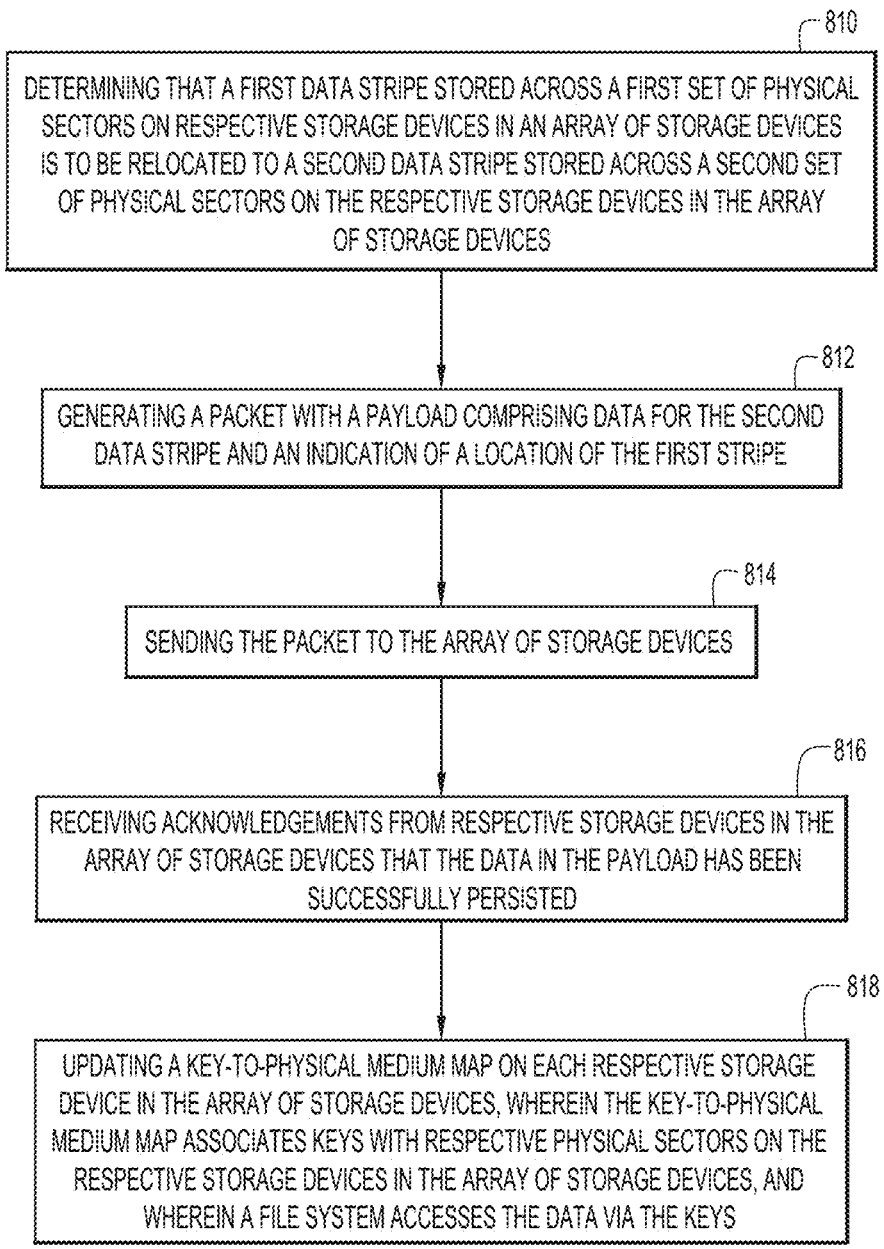
FIG. 8 is a flow chart depicting a series of operations for operating a storage system in accordance with an example embodiment.

FIG. 8 is another flow chart depicting a series of operations for operating a storage system in accordance with an example embodiment. More specifically, the following describes operations for relocating a data stripe from a source stripe to a destination stripe and updating the key-to-physical medium map(s).

In an embodiment, key-to-physical medium map logic 155 (or any individual instantiation thereof) may be configured to provide operations of determining that a first data stripe stored across a first set of physical sectors on respective storage devices in an array of storage devices is to be relocated to a second data stripe stored across a second set of physical sectors on the respective storage devices in the array of storage devices (810), generating a packet with a payload comprising data for the second data stripe (812), sending the packet to the array of storage devices (814), receiving acknowledgments from respective storage devices in the array of storage devices that the data in the payload has been successfully persisted (816), and updating a key-to physical medium map on each respective storage devices in the array of storage devices (818), wherein the key-to-physical medium map associates keys with respective physical sectors on the respective storage devices in the array of storage devices, and wherein a file system accesses the data via the keys.

Figure 9:
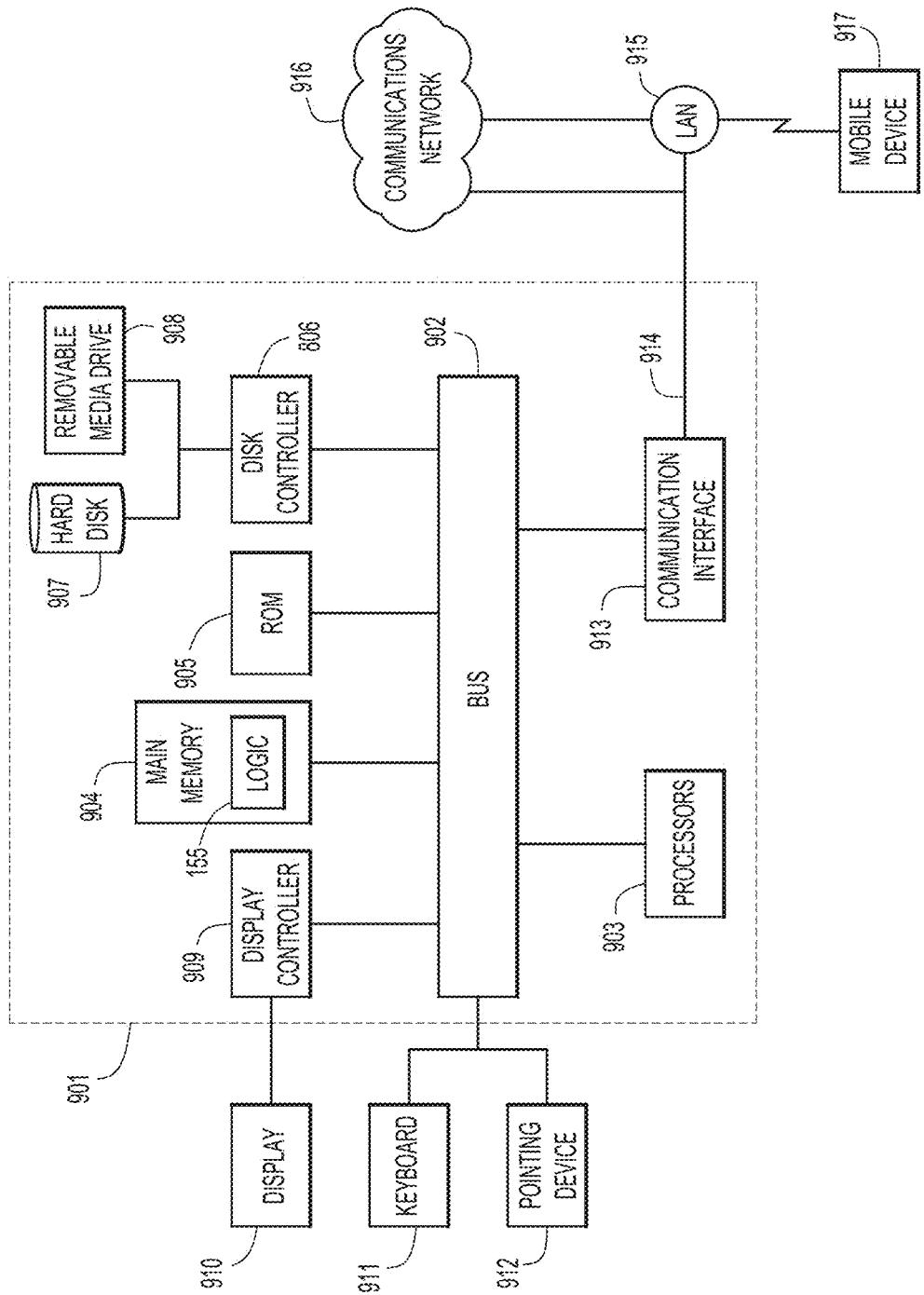
FIG. 9 depicts a device (e.g., a storage system or server device) on which the several described embodiments may be implemented.

FIG. 9 depicts a device (e.g., a storage system or server device) on which the several described embodiments may be implemented.

The device, e.g., storage system 175, may be implemented on or as a computer system 901. The computer system 901 may be programmed to implement a computer based device. The computer system 901 includes a bus 902 or other communication mechanism for communicating information, and a processor 903 coupled with the bus 902 for processing the information. While the figure shows a single block 903 for a processor, it should be understood that the processor 903 represents a plurality of processors or processing cores, each of which can perform separate processing. The computer system 901 may also include a main memory 904, such as a random access memory (RAM) or other dynamic storage device (e.g., dynamic RAM (DRAM), static RAM (SRAM), and synchronous DRAM (SD RAM)), coupled to the bus 902 for storing information and instructions (e.g., the key-to-physical medium map 150 and key-to-physical medium map logic 155) to perform the operations described herein and to be executed by processor 903. In addition, the main memory 904 may be used for storing temporary variables or other intermediate information during the execution of instructions by the processor 903.

The computer system 901 may further include a read only memory (ROM) 905 or other static storage device (e.g., programmable ROM (PROM), erasable PROM (EPROM), and electrically erasable PROM (EEPROM)) coupled to the bus 902 for storing static information and instructions for the processor 903.

The computer system 901 may also include a disk controller 706 coupled to the bus 902 to control one or more storage devices for storing information and instructions, such as a magnetic hard disk 907, and a removable media drive 908 (e.g., floppy disk drive, read-only compact disc drive, read/write compact disc drive, compact disc jukebox, tape drive, and removable magneto-optical drive). The storage devices may be added to the computer system 701 using an appropriate device interface (e.g., small computer system interface (SCSI), integrated device electronics (IDE), enhanced-IDE (E-IDE), direct memory access (DMA), or ultra-DMA).

The computer system 901 may also include special purpose logic devices (e.g., application specific integrated circuits (ASICs)) or configurable logic devices (e.g., simple programmable logic devices (SPLDs), complex programmable logic devices (CPLDs), and field programmable gate arrays (FPGAs)), that, in addition to microprocessors and digital signal processors may individually, or collectively, are types of processing circuitry. The processing circuitry may be located in one device or distributed across multiple devices.

The computer system 901 may also include a display controller 909 coupled to the bus 902 to control a display 910, such as a cathode ray tube (CRT) or liquid crystal display (LCD), for displaying information to a computer user. The computer system 901 may include input devices, such as a keyboard 911 and a pointing device 912, for interacting with a computer user and providing information to the processor 903. The pointing device 912, for example, may be a mouse, a trackball, or a pointing stick for communicating direction information and command selections to the processor 903 and for controlling cursor movement on the display 910. In addition, a printer may provide printed listings of data stored and/or generated by the computer system 901.

The computer system 901 performs a portion or all of the processing operations of the embodiments described herein in response to the processor 903 executing one or more sequences of one or more instructions contained in a memory, such as the main memory 904. Such instructions may be read into the main memory 904 from another computer readable medium, such as a hard disk 907 or a removable media drive 908. One or more processors in a multi-processing arrangement may also be employed to execute the sequences of instructions contained in main memory 904. In alternative embodiments, hard-wired circuitry may be used in place of or in combination with software instructions. Thus, embodiments are not limited to any specific combination of hardware circuitry and software.

As stated above, the computer system 901 includes at least one computer readable medium or memory for holding instructions programmed according to the embodiments presented, for containing data structures, tables, records, or other data described herein. Examples of computer readable media are compact discs, hard disks, floppy disks, tape, magneto-optical disks, PROMs (EPROM, EEPROM, flash EPROM), DRAM, SRAM, SD RAM, or any other magnetic medium, compact discs (e.g., CD-ROM), or any other optical medium, punch cards, paper tape, or other physical medium with patterns of holes, or any other medium from which a computer can read.

Stored on any one or on a combination of non-transitory computer readable storage media, embodiments presented herein include software for controlling the computer system 901, for driving a device or devices for implementing the described embodiments, and for enabling the computer system 901 to interact with a human user. Such software may include, but is not limited to, device drivers, operating systems, development tools, and applications software. Such computer readable storage media further includes a computer program product for performing all or a portion (if processing is distributed) of the processing presented herein.

The computer code may be any interpretable or executable code mechanism, including but not limited to scripts, interpretable programs, dynamic link libraries (DLLs), Java classes, and complete executable programs. Moreover, parts of the processing may be distributed for better performance, reliability, and/or cost.

The computer system 901 also includes a communication interface 913 coupled to the bus 902. The communication interface 913 provides a two-way data communication coupling to a network link 914 that is connected to, for example, a local area network (LAN) 915, or to another communications network 916. For example, the communication interface 913 may be a wired or wireless network interface card or modem (e.g., with SIM card) configured to attach to any packet switched (wired or wireless) LAN or WWAN. As another example, the communication interface 913 may be an asymmetrical digital subscriber line (ADSL) card, an integrated services digital network (ISDN) card or a modem to provide a data communication connection to a corresponding type of communications line. Wireless links may also be implemented. In any such implementation, the communication interface 913 sends and receives electrical, electromagnetic or optical signals that carry digital data streams representing various types of information.

The network link 914 typically provides data communication through one or more networks to other data devices. For example, the network link 914 may provide a connection to another computer through a local area network 915 (e.g., a LAN) or through equipment operated by a service provider, which provides communication services through a communications network 916. The local network 914 and the communications network 916 use, for example, electrical, electromagnetic, or optical signals that carry digital data streams, and the associated physical layer (e.g., CAT 5 cable, coaxial cable, optical fiber, etc.). The signals through the various networks and the signals on the network link 914 and through the communication interface 913, which carry the digital data to and from the computer system 901 may be implemented in baseband signals, or carrier wave based signals. The baseband signals convey the digital data as unmodulated electrical pulses that are descriptive of a stream of digital data bits, where the term "bits" is to be construed broadly to mean symbol, where each symbol conveys at least one or more information bits. The digital data may also be used to modulate a carrier wave, such as with amplitude, phase and/or frequency shift keyed signals that are propagated over a conductive media, or transmitted as electromagnetic waves through a propagation medium. Thus, the digital data may be sent as unmodulated baseband data through a "wired" communication channel and/or sent within a predetermined frequency band, different than baseband, by modulating a carrier wave. The computer system 901 can transmit and receive data, including program code, through the network(s) 915 and 916, the network link 914 and the communication interface 913. Moreover, the network link 914 may provide a connection to a mobile device 917 such as a personal digital assistant (PDA) laptop computer, cellular telephone, or modem and SIM card integrated with a given device.

In summary, in one form, a method is provided. The method includes receiving a write request for first data from a file system, selecting a physical sector on a selected storage device in an array of storage devices on which to store the first data, assigning a key to the physical sector, storing the key and an indication of the physical sector in a key-to-physical medium map, erasure coding the data, including generating parity data associated with the first data, writing the first data and the parity data as a data stripe to each storage device in the array of storage device; and in response to receiving the write request, sending the key to the file system.

The method may further include storing in the key-to-physical medium map, along with the indication of the physical sector, an indication of the selected storage device.

The method may also include storing the key-to-physical medium map on each storage device in the array of storage devices.

In one embodiment, the method includes designating one of the storage devices in the array of storage devices as write leader, and thereafter routing all write requests received from the file system to the write leader.

In one implementation, the method includes after writing the first data and the parity data as a data stripe to each storage device in the array of storage devices, but before sending the key to the file system, receiving an acknowledgement from each storage device in the array of storage devices that respective writes to the storage devices in the array of storage devices was successfully persisted. Alternatively, acknowledgements from an agreed upon number (i.e., a subset) of storage devices depending upon the erasure coding parameters (for example in RAID 5, a response from 3+ out of the 5 disks involved can represent a stable or persistent write).

In another implementation, the method includes writing the first data and the parity data as a data stripe to each storage device in the array of storage devices comprises sending a packet to each storage device in the array of storage devices comprising the first data, the parity data, and the key.

In one embodiment, the method further includes receiving a read request from the file system, the read request including the key, looking up the key in the key-to-physical medium map and obtaining a physical sector on the selected storage device from which to read the first data, reading the first data from the physical sector, and, in response to the read request, returning the first data to the file system.

In an embodiment, the read request is received at one of the storage devices in the array of storage devices that is not the selected storage device.

The method may further include obtaining the first data via an erasure coding recovery mechanism using data, other than the first data, stored the data stripe.

Each storage device in the array of storage devices may be disposed in a single enclosure, or in respective enclosures.

In another form, a device may also be provided in accordance with an embodiment. The device may include an interface unit configured to enable network communications, a memory, and one or more processors coupled to the interface unit and the memory, and configured to: receive a write request for first data from a file system, select a physical sector on a selected storage device in an array of storage devices on which to store the first data, assign a key to the physical sector, store the key and an indication of the physical sector in a key-to-physical medium map, erasure code the data, including generating parity data associated with the first data, write the first data and the parity data as a data stripe to each storage device in the array of storage devices, and, in response to receipt of the write request, send the key to the file system.

The one or more processors may further be configured to store in the key-to-physical medium map, along with the indication of the physical sector, an indication of the selected storage device.

The one or more processors may further be configured to store the key-to-physical medium map on each storage device in the array of storage devices.

The one or more processors may further be configured to designate one of the storage devices in the array of storage devices as write leader, and thereafter route all write requests received from the file system to the write leader.

The one or more processors are further configured to: receive a read request from the file system, the read request including the key, look up the key in the key-to-physical medium map and obtain a physical sector on the selected storage device from which to read the first data, read the first data from the physical sector, and, in response to the read request, return the first data to the file system.

In still another form, a non-transitory computer readable storage media is provided that is encoded with instructions that, when executed by a processor, cause the processor to perform operations including: receive a write request for first data from a file system, select a physical sector on a selected storage device in an array of storage devices on which to store the first data, assign a key to the physical sector, store the key and an indication of the physical sector in a key-to-physical medium map, erasure code the data, including generating parity data associated with the first data, write the first data and the parity data as a data stripe to each storage device in the array of storage devices, and in response to receiving of the write request, send the key to the file system.

The instructions may further include instructions that, when executed by a processor, cause the processor to store in the key-to-physical medium map, along with the indication of the physical sector, an indication of the selected storage device.

The instructions may further include instruction that, when executed by a processor, cause the processor to store the key-to-physical medium map on each storage device in the array of storage devices.

The instructions may further include instruction that, when executed by a processor, cause the processor to designate one of the storage devices in the array of storage devices as write leader, and thereafter route all write requests received from the file system to the write leader.

Another method is provided that includes determining that a first data stripe stored across a first set of physical sectors on respective storage devices in an array of storage devices is to be relocated to a second data stripe stored across a second set of physical sectors on the respective storage devices in the array of storage devices, generating a packet with a payload comprising data for the second data stripe and an indication of a location of the first stripe, sending the packet to the array of storage devices, receiving acknowledgments from respective storage devices in the array of storage devices that the data in the payload has been successfully persisted, updating a key-to physical medium map on each respective storage devices in the array of storage devices, wherein the key-to-physical medium map associates keys with respective physical sectors on the respective storage devices in the array of storage devices, and wherein a file system accesses the data via the keys.

In the method the data comprises parity data associated with an erasure coding scheme.

In the method, determining that a first data stripe stored across a first set of physical sectors on respective storage devices in an array of storage devices is to be relocated to a second data stripe stored across a second set of physical sectors on the respective storage devices in the array of storage devices comprises determining that a given one of the physical sectors used in connection with the first data stripe cannot be accessed.

The method may further comprise comprising recovering information in the given one of the physical sectors using an erasure coding recovery process, and including the information with the data.

In the method, determining that a first data stripe stored across a first set of physical sectors on respective storage devices in an array of storage devices is to be relocated to a second data stripe stored across a second set of physical sectors on the respective storage devices in the array of storage devices comprises determining that information in a given one of the physical sectors is no longer referred to by the file system.

The method may still further include deleting the first stripe after sending another packet for a third data stripe to be stored across a third set of physical sectors on the respective storage devices in the array of storage devices.

The method may also include deleting multiple stripes in a batch after sending another packet for a third data stripe to be stored across a third set of physical sectors on the respective storage devices in the array of storage devices.

In another form, a device is provided that comprises an interface unit configured to enable network communications, a memory, and one or more processors coupled to the interface unit and the memory, and configured to: generate a packet with a payload comprising data for the second data stripe and an indication of a location of the first stripe, send the packet to the array of storage devices, receive acknowledgments from respective storage devices in the array of storage devices that the data in the payload has been successfully persisted, and update a key-to physical medium map on each respective storage devices in the array of storage devices, wherein the key-to-physical medium map associates keys with respective physical sectors on the respective storage devices in the array of storage devices, and wherein a file system accesses the data via the keys.

The data may comprise parity data associated with an erasure coding scheme.

The one or more processors may be configured to determine that a first data stripe stored across a first set of physical sectors on respective storage devices in an array of storage devices is to be relocated to a second data stripe stored across a second set of physical sectors on the respective storage devices in the array of storage devices by determining that a given one of the physical sectors used in connection with the first data stripe cannot be accessed.

The one or more processors may further be configured to recover information in the given one of the physical sectors using an erasure coding recovery process, and include the information with the data.

The one or more processors may be configured to determine that a first data stripe stored across a first set of physical sectors on respective storage devices in an array of storage devices is to be relocated to a second data stripe stored across a second set of physical sectors on the respective storage devices in the array of storage devices by determining that information in a given one of the physical sectors is no longer referred to by the file system.

The one or more processors may be configured to delete the first stripe after the one or more processors send another packet for a third data stripe to be stored across a third set of physical sectors on the respective storage devices in the array of storage devices.

The one or more processors may be configured to delete multiple stripes in a batch after the one or more processors send another packet for a third data stripe to be stored across a third set of physical sectors on the respective storage devices in the array of storage devices.

In still another form, a non-transitory computer readable storage media is provided that is encoded with instructions that, when executed by a processor, cause the processor to: generate a packet with a payload comprising data for the second data stripe and an indication of a location of the first stripe, send the packet to the array of storage devices, receive acknowledgments from respective storage devices in the array of storage devices that the data in the payload has been successfully persisted, and update a key-to physical medium map on each respective storage devices in the array of storage devices, wherein the key-to-physical medium map associates keys with respective physical sectors on the respective storage devices in the array of storage devices, and wherein a file system accesses the data via the keys.

The data may comprise parity data associated with an erasure coding scheme.

The instructions may further include instructions that, when executed by a processor, cause the processor to determine that a first data stripe stored across a first set of physical sectors on respective storage devices in an array of storage devices is to be relocated to a second data stripe stored across a second set of physical sectors on the respective storage devices in the array of storage devices by determining that a given one of the physical sectors used in connection with the first data stripe cannot be accessed.

The instructions may further include instructions that, when executed by a processor, cause the processor to recover information in the given one of the physical sectors using an erasure coding recovery process, and include the information with the data.

The instructions may further include instructions that, when executed by a processor, cause the processor to determine that a first data stripe stored across a first set of physical sectors on respective storage devices in an array of storage devices is to be relocated to a second data stripe stored across a second set of physical sectors on the respective storage devices in the array of storage devices by determining that information in a given one of the physical sectors is no longer referred to by the file system.

Each storage device in the array of storage devices may be disposed in a respective enclosure.

The above description is intended by way of example only. Various modifications and structural changes may be made therein without departing from the scope of the concepts described herein and within the scope and range of equivalents of the claims.

What is claimed is:

1. A method comprising:
receiving a write request for first data from a file system;
selecting a physical sector on a selected storage device in an array of storage devices on which to store the first data;
assigning a key to the physical sector;
storing the key and an indication of the physical sector in a key-to-physical medium map;
erasure coding the first data, including generating parity data associated with the first data;
writing the first data and the parity data as a data stripe to each storage device in the array of storage devices;
in response to receiving the write request, sending the key to the file system;
designating one of the storage devices in the array of storage devices as a first write leader;
routing subsequent write requests from the file system only to the first write leader;
executing a write leader election algorithm to designate another of the storage devices in the array of storage devices as a second write leader, different from the first write leader; and
after designating the second write leader, routing further subsequent write requests from the file system only to the second write leader.

2. The method of claim 1, further comprising storing in the key-to-physical medium map, along with the indication of the physical sector, an indication of the selected storage device.

3. The method of claim 1, further comprising storing the key-to-physical medium map on each storage device in the array of storage devices.

4. The method of claim 1, further comprising after writing the first data and the parity data as a data stripe to each storage device in the array of storage devices, but before sending the key to the file system, receiving an acknowledgement from each storage device in the array of storage devices that respective writes to each storage device in the array of storage devices was successfully persisted.

5. The method of claim 1, wherein writing the first data and the parity data as a data stripe to each storage device in the array of storage devices comprises sending a packet to each storage device in the array of storage devices comprising the first data, the parity data, and the key.

6. The method of claim 1, further comprising:
receiving a read request from the file system, the read request including the key;
looking up the key in the key-to-physical medium map and obtaining a physical sector on the selected storage device from which to read the first data;
reading the first data from the physical sector; and
in response to the read request, returning the first data to the file system.

7. The method of claim 6, wherein the read request is received at one of the storage devices in the array of storage devices that is not the selected storage device.

8. The method of claim 7, further comprising obtaining the first data via an erasure coding recovery mechanism using data, other than the first data, stored the data stripe.

9. The method of claim 1, wherein each storage device in the array of storage devices is disposed in a single enclosure.

10. The method of claim 1, wherein each storage device in the array of storage devices is disposed in respective enclosures.

11. A device comprising:
an interface unit configured to enable network communications;
a memory;
and one or more processors coupled to the interface unit and the memory, and configured to:
receive a write request for first data from a file system;
select a physical sector on a selected storage device in an array of storage devices on which to store the first data;
assign a key to the physical sector;
store the key and an indication of the physical sector in a key-to-physical medium map;
erasure code the first data, including generating parity data associated with the first data;
write the first data and the parity data as a data stripe to each storage device in the array of storage devices;
in response to receipt of the write request, send the key to the file system;
designate one of the storage devices in the array of storage devices as a first write leader;
route subsequent write requests from the file system only to the first write leader;
execute a write leader election algorithm to designate another of the storage devices in the array of storage devices as a second write leader, different from the first write leader; and
after the second write leader is designated, route further subsequent write requests from the file system only to the second write leader.

12. The device of claim 11, wherein the one or more processors are further configured to store in the key-to-physical medium map, along with the indication of the physical sector, an indication of the selected storage device.

13. The device of claim 11, wherein the one or more processors are further configured to store the key-to-physical medium map on each storage device in the array of storage devices.

14. The device of claim 11, wherein the one or more processors are further configured to
receive a read request from the file system, the read request including the key;
look up the key in the key-to-physical medium map and obtain a physical sector on the selected storage device from which to read the first data;
read the first data from the physical sector; and
in response to the read request, return the first data to the file system.

15. A non-transitory computer readable storage media encoded with instructions that, when executed by a processor, cause the processor to:
receive a write request for first data from a file system;
select a physical sector on a selected storage device in an array of storage devices on which to store the first data;
assign a key to the physical sector;
store the key and an indication of the physical sector in a key-to-physical medium map;
erasure code the first data, including generating parity data associated with the first data;

write the first data and the parity data as a data stripe to each storage device in the array of storage devices;

in response to receiving the write request, send the key to the file system;

designate one of the storage devices in the array of storage devices as a first write leader;

route subsequent write requests from the file system only to the first write leader;

execute a write leader election algorithm to designate another of the storage devices in the array of storage devices as a second write leader, different from the first write leader; and after the second write leader is designated, route further subsequent write requests from the file system only to the second write leader.

16. The non-transitory computer readable storage media of claim 15, further including instructions that, when executed by a processor, cause the processor to store in the key-to-physical medium map, along with the indication of the physical sector, an indication of the selected storage device.

17. The non-transitory computer readable storage media of claim 15, further including instructions that, when executed by a processor, cause the processor to store the key-to-physical medium map on each storage device in the array of storage devices.

* * * * *